(12) United States Patent
Yonemura et al.

(10) Patent No.: US 12,514,125 B2
(45) Date of Patent: Dec. 30, 2025

(54) INJECTION-MOLDED ARTICLE OF POLYMER PIEZOELECTRIC MATERIAL, PIEZOELECTRIC ELEMENT, APPARATUS FOR MANUFACTURING INJECTION-MOLDED ARTICLE OF POLYMER PIEZOELECTRIC MATERIAL, AND METHOD FOR MANUFACTURING INJECTION-MOLDED ARTICLE OF POLYMER PIEZOELECTRIC MATERIAL

(71) Applicant: Seiko Epson Corporation, Tokyo (JP)

(72) Inventors: Takayuki Yonemura, Suwa (JP);
Akihiko Tsunoya, Okaya (JP); Koichi Murayama, Chino (JP)

(73) Assignee: SEIKO EPSON CORPORATION (JP)

( * ) Notice: Subject to any disclaimer, the term of this patent is extended or adjusted under 35 U.S.C. 154(b) by 1009 days.

(21) Appl. No.: 17/586,986

(22) Filed: Jan. 28, 2022

(65) Prior Publication Data
US 2022/0246827 A1   Aug. 4, 2022

(30) Foreign Application Priority Data

Jan. 29, 2021   (JP) ................. 2021-013650

(51) Int. Cl.
*H01L 41/187*   (2006.01)
*H10N 30/00*    (2023.01)
(Continued)

(52) U.S. Cl.
CPC ......... *H10N 30/702* (2024.05); *H10N 30/098* (2023.02); *H10N 30/857* (2023.02)

(58) Field of Classification Search
CPC .............. H10N 30/702; H10N 30/857
(Continued)

(56) References Cited

U.S. PATENT DOCUMENTS

| 10,857,731 B2 | 12/2020 | Saito et al. |
| 11,370,168 B2 | 6/2022 | Saito et al. |

(Continued)

FOREIGN PATENT DOCUMENTS

| EP | 3258508 A1 | 12/2017 |
| JP | H05-152638 A | 6/1993 |

(Continued)

OTHER PUBLICATIONS

Hayashi et al., "Piezoelectric characteristics of three-dimensional solid object of poly(L-lactide) fabricated by three-dimensional printing", Japanese Journal of Applied Physics, 54, 10NF01, (2015) 3 pgs.

(Continued)

*Primary Examiner* — Derek J Rosenau
(74) *Attorney, Agent, or Firm* — Harness, Dickey & Pierce, P.L.C.

(57) ABSTRACT

An injection-molded article of polymer piezoelectric material includes: a helical chiral polymer constituted by a polymer chain and having a unit cell with an a-axis, a b-axis, and a c-axis as crystal axes, wherein b-axis<a-axis<c-axis in terms of lengths of the crystal axes, the c-axis is parallel to a long chain direction of the polymer chain, the helical chiral polymer is a crystal in which the b-axis is uniaxially oriented, and the injection-molded article has piezoelectricity.

12 Claims, 9 Drawing Sheets

(51) Int. Cl.
*H10N 30/098* (2023.01)
*H10N 30/857* (2023.01)

(58) Field of Classification Search
USPC ........................................................ 310/800
See application file for complete search history.

(56) References Cited

U.S. PATENT DOCUMENTS

| | | |
|---|---|---|
| 2012/0025674 A1 | 2/2012 | Yoshida et al. |
| 2018/0022895 A1* | 1/2018 | Sato ..................... H10N 30/857 |
| | | 310/311 |
| 2018/0108826 A1 | 4/2018 | Tajitsu et al. |
| 2019/0061248 A1 | 2/2019 | Saito et al. |
| 2020/0078998 A1 | 3/2020 | Lawless, III et al. |
| 2021/0001550 A1 | 1/2021 | Saito et al. |

FOREIGN PATENT DOCUMENTS

| | | |
|---|---|---|
| JP | 5383790 B2 | 1/2014 |
| JP | 6271121 B2 | 1/2018 |
| JP | 2019-038167 A | 3/2019 |
| JP | 6592780 B2 | 10/2019 |
| JP | 2020-026085 A | 2/2020 |
| JP | 6663085 B2 | 3/2020 |
| WO | 2015/129291 A1 | 9/2015 |
| WO | 2016/175321 A1 | 11/2016 |

OTHER PUBLICATIONS

Yoshida et al., "A Study of Mechanism of High Piezoelectric Performance Poly (lactic acid) Film Manufactured by Solid-State Extrusion", Proceedings of the Institute of Electrostatics Japan, 40, 1 (2016), pp. 38-43.

Marsilla, Ku Ishak Ku et al.: "Crystallization of itaconic anhydride grafted poly(lactic acid) during annealing"; Journal of Applied Polymer Science; 2017; DOI: 10.1002/APP.44614 (12 pages).

Barbosa, P. et al.: "Piezoelectric poly(lactide) stereocomplexes with a cholinium organic ionic plastic crystal"; Journal of Materials Chemistry C; 2017; 5; pp. 12134-12142 (9 pages).

\* cited by examiner

INJECTION-MOLDED ARTICLE OF POLYMER PIEZOELECTRIC MATERIAL, PIEZOELECTRIC ELEMENT, APPARATUS FOR MANUFACTURING INJECTION-MOLDED ARTICLE OF POLYMER PIEZOELECTRIC MATERIAL, AND METHOD FOR MANUFACTURING INJECTION-MOLDED ARTICLE OF POLYMER PIEZOELECTRIC MATERIAL

The present application is based on, and claims priority from JP Application Serial Number 2021-013650, filed Jan. 29, 2021, the disclosure of which is hereby incorporated by reference herein in its entirety.

BACKGROUND

1. Technical Field

The present disclosure relates to an injection-molded article of polymer piezoelectric material, a piezoelectric element, an apparatus for manufacturing an injection-molded article of polymer piezoelectric material, and a method for manufacturing an injection-molded article of polymer piezoelectric material.

2. Related Art

Polymer piezoelectric materials that use helical chiral polymers are known. It is possible to shape polymer piezoelectric materials by a three-dimensional shaping apparatus while taking advantage of their features as polymer. In other words, by using a three-dimensional shaping apparatus, it is possible to shape a structure having a desired three-dimensional structure and having piezoelectricity.

For example, WO 2015/129291 discloses: heating a piezoelectric polymer to a temperature greater than or equal to its crystallization temperature and less than its melting point; shaping a shaping material having a reduced viscosity due to heating using a 3D printer to obtain a box-shaped structure; and fabricating a pressure sensor using the obtained structure. It is also disclosed that heating to a temperature greater than or equal to the crystallization temperature and less than the melting point enables the piezoelectric polymer to be oriented, and that molecules of polylactic acid are oriented along the movement direction of the nozzle of the three-dimensional shaping apparatus. By uniaxially orienting the piezoelectric polymer in this way, the structure exhibits piezoelectricity.

Moreover, WO 2015/129291 discloses polylactic acid as a polymer piezoelectric material. Polylactic acid is a polymer that has chirality and of which the principal chain is helical-shaped. As such, polylactic acid is a helical chiral polymer, In a polymer of polylactic acid, the screw axis of the molecule is c-axis. When a shaping material containing polylactic acid is laminated while being pulled by the nozzle of the three-dimensional shaping apparatus, a structure can be obtained in which the c-axes are uniaxially oriented in the pulling direction. In such a structure, when shear stress is applied in parallel with the pulling direction (c-axis direction), a charge corresponding to the magnitude of the stress is generated in a direction intersecting the surface to which the shear stress is applied.

However, shear stress is difficult to utilize as is for practical use. Specifically, shear stress is stress that acts in directions opposite to each other along two lines of action, each of the two lines of action being parallel to the c-axis but shifted from each other. Being stress having such properties, shear stress is difficult to apply to practical devices and the like.

SUMMARY

An injection-molded article of polymer piezoelectric material according to an application example of the present disclosure includes: a helical chiral polymer constituted by a polymer chain and having a unit cell with an a-axis, a b-axis, and a c-axis as crystal axes, wherein b-axis<a-axis<c-axis in terms of lengths of the crystal axes, the c-axis is parallel to a long chain direction of the polymer chain, the helical chiral polymer is a crystal in which the b-axis is uniaxially oriented, and the injection-molded article has piezoelectricity.

A piezoelectric element according to an application example of the present disclosure includes: the injection-molded article of polymer piezoelectric material according to an application example of the present disclosure, and two electrode layers configured to sandwich the injection-molded article of polymer piezoelectric material.

An apparatus for manufacturing an injection-molded article of polymer piezoelectric material according to an application example of the present disclosure includes: a melting unit configured to heat a raw material containing a helical chiral polymer to obtain a molten material, an injection portion configured to inject the molten material, and a support surface configured to receive the injected molten material to obtain an injection-molded article having piezoelectricity, wherein a temperature of the support surface is greater than or equal to a phase transition temperature of the helical chiral polymer at which a phase transition from a metastable phase to a stable phase takes place, and less than a melting point of the helical chiral polymer.

A method for manufacturing an injection-molded article of polymer piezoelectric material according to an application example of the present disclosure includes: heating a raw material containing a helical chiral polymer to obtain a molten material, injecting the molten material from an injection portion, and receiving the injected molten material at a support surface to obtain an injection-molded article having piezoelectricity, wherein a temperature of the support surface is greater than or equal to a phase transition temperature of the helical chiral polymer at which a phase transition from a metastable phase to a stable phase takes place, and less than a melting point of the helical chiral polymer.

DESCRIPTION OF EXEMPLARY EMBODIMENTS

Hereinafter, an injection-molded article of polymer piezoelectric material, a piezoelectric element, an apparatus for manufacturing an injection-molded article of polymer piezoelectric material, and a method for manufacturing an injection-molded article of polymer piezoelectric material according to the present disclosure will be described in detail with reference to the attached drawings.

1. Injection-Molded Article of Polymer Piezoelectric Material and Piezoelectric Element First, an injection-molded article of polymer piezoelectric material and a piezoelectric element according to an embodiment will be described.

Figure 1:
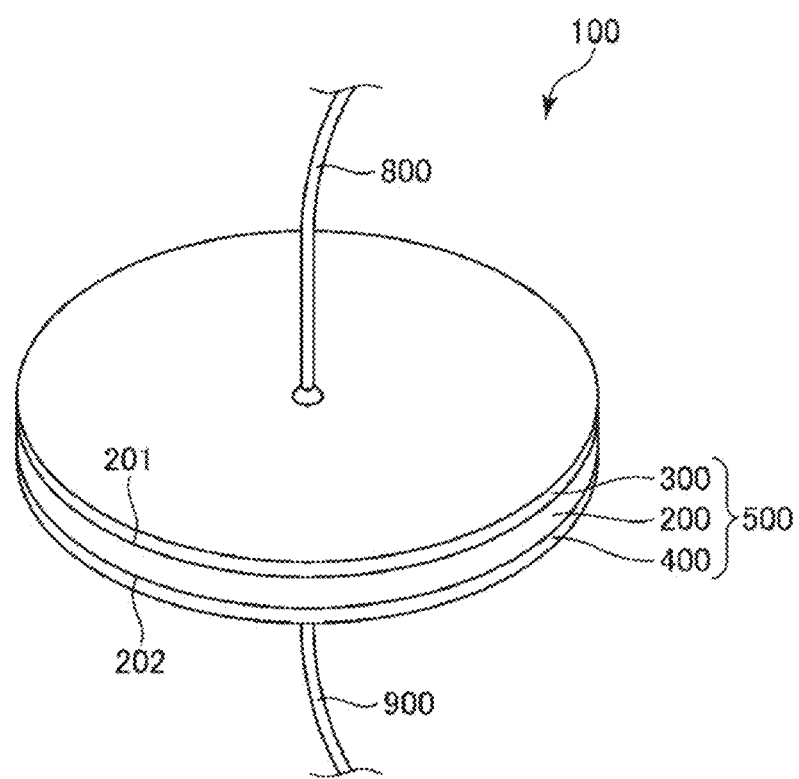
FIG. 1 is a perspective view illustrating a piezoelectric element according to an embodiment.

FIG. 1 is a perspective view illustrating a piezoelectric element according to an embodiment.

A piezoelectric element 100 illustrated in FIG. 1 includes a laminate 500 including a piezoelectric layer 200, a first electrode layer 300, and a second electrode layer 400. The piezoelectric layer 200 includes a first surface 201 and a second surface 202 that are the obverse and reverse of each other. The first electrode layer 300 is provided on the first surface 201 of the piezoelectric layer 200. The second electrode layer 400 is provided on the second surface 202 of the piezoelectric layer 200.

Note that the piezoelectric element 100 may include members other than these members. For example, an adhesive layer or the like may be interposed between the piezoelectric layer 200 and the first electrode layer 300, or between the piezoelectric layer 200 and the second electrode layer 400. A protective film or the like that covers the laminate 500 may also be provided.

The laminate 500 illustrated in FIG. 1 has a circular shape in plan view. In other words, each of the piezoelectric layer 200, the first electrode layer 300, and the second electrode layer 400 has a circular shape in plan view. Circular shapes include, for example, a perfect circle, an ellipse, and an oval. A circular shape may be a perfect circle. Perfect circle refers to a shape that is circular and in which the difference between the length of the long axis and the length of the short axis is less than or equal to 10% of the length of the long axis. The long axis is the longest axis that can be established in plan view, while the short axis is an axis that passes through a midpoint of the long axis in plan view and that is orthogonal to the long axis. Note that these shapes in plan view are not limited to circular shapes, and may be other shapes. Plan view herein refers to the view along the thickness direction of the piezoelectric layer 200.

A first wiring 800 and a second wiring 900 are coupled to the piezoelectric element 100. One end of the first wiring 800 is coupled to a center portion of the first electrode layer 300 that has a circular shape. One end of the second wiring 900 is coupled to a center portion of the second electrode layer 400 that has a circular shape.

The other end of the first wiring 800 and the other end of the second wiring 900 are each coupled, for example, to a power supply apparatus (not illustrated). This makes it possible to apply a voltage across the first electrode layer 300 and the second electrode layer 400 to cause the piezoelectric layer 200 to exhibit the inverse piezoelectric effect. In this case, the piezoelectric element 100 is incorporated into and used in devices such as actuators, vibration generating elements, and ultrasonic motors, for example.

The other end of the first wiring 800 and the other end of the second wiring 900 may also be coupled, for example, to a charge detection apparatus (not illustrated), respectively. This makes it possible to take out the charge generated by the piezoelectric effect at the piezoelectric layer 200 from the first electrode layer 300 and the second electrode layer 400 to cause the charge detection apparatus to detect the charge amount. Based on the detected charge amount, the force applied to the piezoelectric layer 200 can be determined, or the power required for a switch operation or power generation can be generated. In this case, the piezoelectric element 100 is incorporated into and used in various types of force sensors such as tactile sensors and force sensing sensors, various types of switches, and devices such as power generating elements, for example. The piezoelectric element 100 may also be coupled to a voltage detection apparatus. This makes it possible to detect the voltage generated by the piezoelectric effect with the voltage detection apparatus.

Examples of the constituent materials of the first electrode layer 300 and the second electrode layer 400 include metal materials such as single substances of metal elements such as gold, silver, platinum, copper, nickel, aluminum, indium, tin, zinc, and palladium, or alloys or intermetallic compounds containing any of these metal elements, as well as resin materials such as conductive polymers.

The average thickness of the first electrode layer 300 and the second electrode layer 400 is not particularly limited. However, the average thickness of the first electrode layer 300 and the second electrode layer 400 may be 0.05 μm or greater and 500 μm or less, and may be 0.50 μm or greater and 300 μm or less.

The average thickness of the piezoelectric layer 200 is not particularly limited. However, the average thickness of the piezoelectric layer 200 may be 10 μm or greater, may be 30 μm or greater and 50 μm or less, and may be 50 μm or greater and 5 mm or less. This causes the piezoelectric layer 200 to have sufficient piezoelectric performance.

The piezoelectric layer 200 is an injection-molded article that contains helical chiral polymer and that has piezoelectricity. This piezoelectric layer 200 is an injection-molded article of polymer piezoelectric material according to an embodiment. Helical chiral polymer refers to a polymer of which the molecular structure has a helical structure and that has molecular optical activity. Further, a helical chiral polymer refers to a crystal of such a helical chiral polymer.

Examples of helical chiral polymers include, for example, polypeptides, cellulose derivatives, polylactic acid, polypropylene oxides, and poly-β-hydroxybutyric acid. The helical chiral polymer used in the present embodiment is constituted by a polymer chain and has a unit cell with an a-axis, a b-axis, and a c-axis as crystal axes. In the present embodiment, b-axis<a-axis<c-axis in terms of lengths of the crystal axes. Note that it is common with a polymer that a crystal axis parallel to the long chain direction of the polymer chain is long. Thus, in the present embodiment, the long chain direction of the polymer chain is the c-axis.

Hereinafter, polylactic acid will be described as an example of helical chiral polymers. For polylactic acid having optical activity, poly-L-lactic acid (PLLA) and poly-D-lactic acid (PDLA) are known. Hereinafter, poly-L-lactic acid, and in particular the α-phase of poly-L-lactic acid, which is stable among the crystal phases of poly-L-lactic acid, will be described as an example. Note that in the description below, the α-phase of poly-L-lactic acid is simply referred to as "polylactic acid".

Figure 2A:
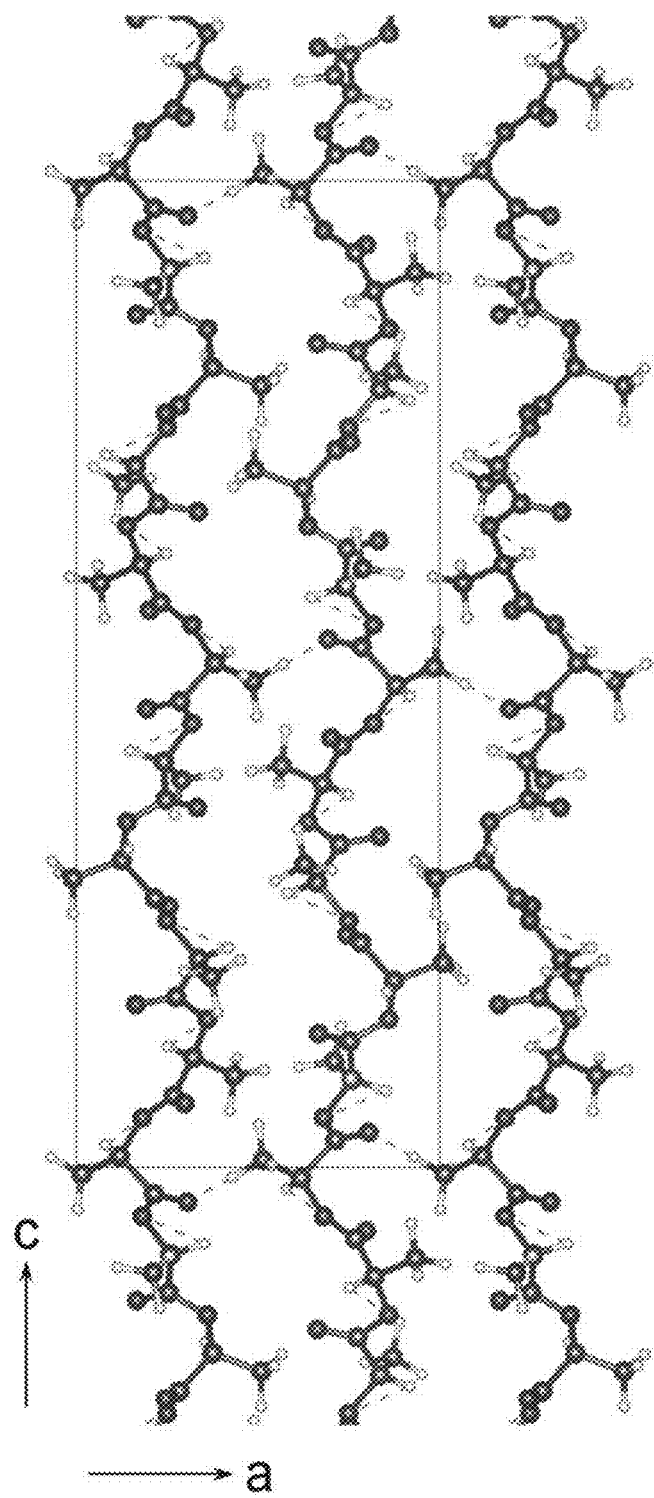
FIG. 2A is a schematic view illustrating a molecular structure of a polylactic acid.
Figure 2B:
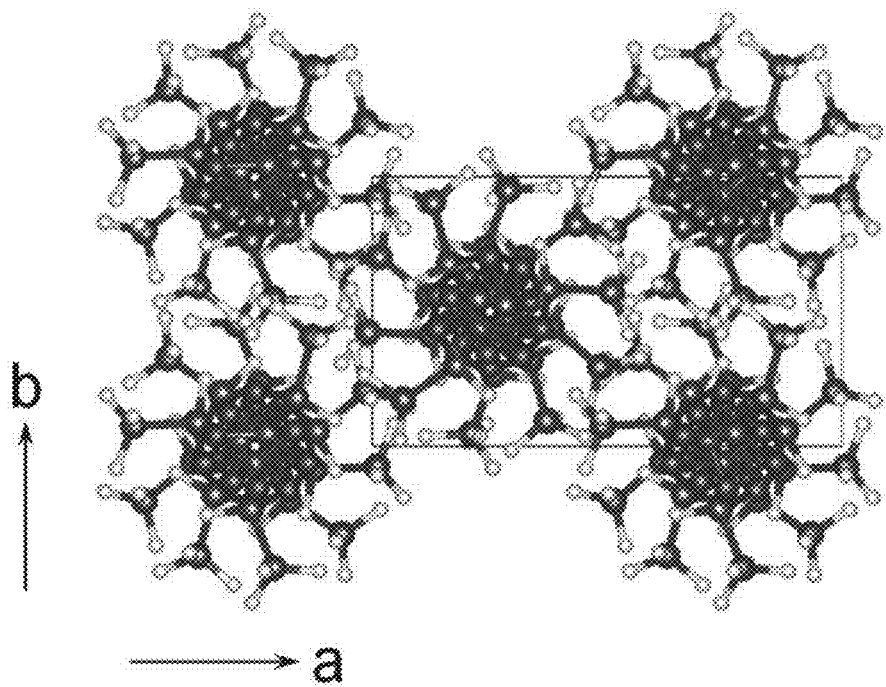
FIG. 2B is a schematic view illustrating a molecular structure of a polylactic acid.

FIGS. 2A and 2B are each a schematic view illustrating a molecular structure of a polylactic acid.

As illustrated in FIGS. 2A and 2B, the molecular structure of a polylactic acid has a helical structure. The crystal system of a polylactic acid is orthorhombic (orthorhombic). The length of the a-axis of the unit cell is approximately 1.06 nm, the length of the b-axis is approximately 0.61 nm, and the length of the c-axis is approximately 2.88 nm. Note that FIG. 2A illustrates a plane of a polylactic acid including the a-axis and the c-axis, while FIG. 2B illustrates a plane of a polylactic acid including the a-axis and the b-axis.

Figure 3:
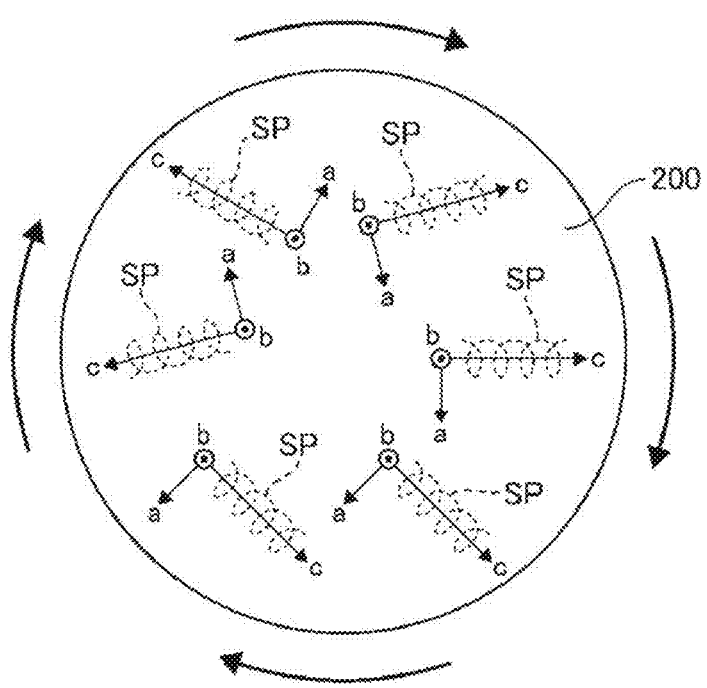
FIG. 3 is a schematic view of a piezoelectric layer included in the piezoelectric element illustrated in FIG. 1.

FIG. 3 is a schematic view of the piezoelectric layer 200 included in the piezoelectric element illustrated in FIG. 1. It is sufficient that this piezoelectric layer 200 contains a polylactic acid. However, the piezoelectric layer 200 may contain polylactic acid as main material. The content of polylactic acid in the piezoelectric layer 200 may be 30 mass % or greater, may be 50 mass % or greater, and may be 70 mass % or greater. Note that other than polylactic acid, the piezoelectric layer 200 may contain amorphous polylactic acid, for example. Furthermore, other than the aforementioned α-phase of poly-L-lactic acid, the piezoelectric layer 200 may contain a metastable phase such as the α'-phase and the β-phase of poly-L-lactic acid, and may contain poly-D-lactic acid.

The piezoelectric layer 200 according to the present embodiment contains crystals in which polylactic acid has a b-axis orientation. B-axis orientation refers to a state in which b-axes of polylactic acid are uniaxially oriented. The direction in which b-axes are oriented is not particularly limited. However, in the present embodiment, the direction in which b-axes are oriented is the thickness direction of the piezoelectric layer 200, that is, a direction orthogonal to the plane in which the piezoelectric layer 200 spreads. On the other hand, in the present embodiment, c-axes of polylactic acid are oriented in the plane of the piezoelectric layer 200.

The state of orientation described above is schematically illustrated in FIG. 3. In FIG. 3, the molecular structure of polylactic acid is represented by spirals SP. The axis of travel of the spiral SP is parallel to the c-axis. As illustrated in FIG. 3, in the piezoelectric layer 200, c-axes of polylactic acid face in various directions in the plane, while b-axes are uniaxially oriented in the thickness direction.

In helical chiral polymers such as polylactic acid, when shear stress parallel to the c-axis is applied, rotational motion of the C=O electric dipole is induced in the helical structure. Consequently, polarization appears in a direction intersecting the shear plane including the applied two shear stress vectors. At this time, the helical structure of the helical chiral polymer necessarily has 2-fold rotational symmetry. For this reason, with an optically active helical chiral polymer, when the tilt angle with respect to shear stress is θ, the force corresponding to the product of the shear stress and the absolute value of cos θ effectively acts. For this reason, when directions of the spirals SP of the piezoelectric layer 200 are random, approximately 64% of the force that would act when spirals SP are oriented in the shear stress direction effectively acts. For this reason, similar to when spirals SP are in an in-plane orientation, polarization appears in the thickness direction of the piezoelectric layer 200.

In addition, when c-axes are in an in-plane orientation, polarization typically changes depending on the orientation of the c-axes and the angle of the applied shear stress. In this embodiment, however, polarization occurs independent of the angle of shear stress. For this reason, when rotational stress such as that indicated by the arrows in FIG. 3 is applied, polarization appears in the thickness direction of the piezoelectric layer 200.

By taking out the charge generated by this polarization from the first electrode layer 300 and the second electrode layer 400, the piezoelectric element 100 functions as a sensor for detecting shear stress and rotational stress applied to the piezoelectric layer 200. Furthermore, applying a voltage across the first electrode layer 300 and the second electrode layer 400 can generate shear stress and rotational stress in the piezoelectric layer 200.

With such uniaxial orientation of b-axes exhibited in the piezoelectric layer 200, it is possible to increase the piezoelectric constant compared to when b-axes are not oriented. This makes it possible to realize a piezoelectric element 100 having excellent piezoelectric characteristics.

Uniaxial orientation of b-axes of polylactic acid can be identified by acquiring and analyzing an X-ray diffraction profile of the piezoelectric layer 200. Specifically, first, θ-2θ measurements are performed on the piezoelectric layer 200 using an X-ray diffractometer to acquire a θ-2θ profile.

When b-axes of polylactic acid are uniaxially oriented, the θ-2θ profile obtained by θ-2θ measurements in the X-ray diffractometer has a peak corresponding to the (010) plane of polylactic acid. This peak is observed at 2θ=14.7°±1.5°. Note that this peak position is a peak position obtained by θ-2θ measurements using a characteristic X-ray of CuKα1 having a wavelength of 1.5404 Å.

Next, a pole figure is acquired with the 2θ position fixed to a peak corresponding to the (010) plane of polylactic acid. For example, a pole figure is acquired with the 2θ position fixed at 2θ=14.7°. In this pole figure, contour lines can be acquired in which the diffraction intensity decreases approximately concentrically from the center, which is ψ=0°.

Moreover, based on this pole figure, a rocking curve profile, which is a profile obtained while changing ψ, is acquired. When b-axes of polylactic acid are uniaxially oriented, the rocking curve profile acquired for the peak corresponding to the (010) plane of polylactic acid has a peak at ψ=0°.

By confirming such a peak, it can be confirmed that b-axes of polylactic acid are well uniaxially oriented.

As described above, the piezoelectric layer 200, which is an injection-molded article of polymer piezoelectric material according to the present embodiment, is an injection-molded article that contains helical chiral polymer and that has piezoelectricity. As described previously, a helical chiral polymer s a crystal of a polymer of which the molecular structure is a helical structure and that has molecular optical activity. Further, in the present embodiment, a helical chiral polymer has a unit cell with an a-axis, a b-axis, and a c-axis as crystal axes, and is constituted by a polymer chain. Furthermore, a helical chiral polymer is a crystal in which the lengths of the crystal axes satisfy the relationship of b-axis<a-axis<c-axis, the c-axis is parallel to the long chain direction of the polymer chain, and b-axes are uniaxially oriented.

According to such a configuration, a piezoelectric layer 200 is obtained that exhibits at least the piezoelectric phenomenon, in which a direction of rotation about the b-axis serves as the stress application direction. Furthermore, upon application of a voltage, such a piezoelectric layer 200 exhibits the inverse piezoelectric phenomenon, in which a direction of rotation about the b-axis serves as the stress generation direction. Therefore, such a piezoelectric layer 200 demonstrates not only the piezoelectricity associated with shear stress exhibited by conventional piezoelectric layers but also the piezoelectricity of rotation, and thus contributes to the realization of an easy-to-use piezoelectric element 100. Specifically, the piezoelectric layer 200 is applicable to devices such as sensors that detect rotational stress, and actuators that utilize rotational stress. Therefore, according to the piezoelectric layer 200, a piezoelectric element 100 having high practicality can be realized.

Furthermore, as described previously, helical chiral polymer contained in the piezoelectric layer 200 are polylactic acid. Polylactic acid is particularly useful as a material for injection-molded articles because it has relatively high mechanical strength and excellent formability. In other words, including polylactic acid can increase the mechanical strength and formability of the piezoelectric layer 200.

Furthermore, the piezoelectric element 100 according to the present embodiment includes the piezoelectric layer 200, which is an injection-molded article of polymer piezoelectric material, and the first electrode layer 300 and the second electrode layer 400 that sandwich the piezoelectric layer 200.

According to such a configuration, it is possible to realize a piezoelectric element 100 that exhibits the piezoelectric phenomenon associated with rotational stress and the inverse piezoelectric phenomenon, in which a rotational direction serves as the stress generation direction. Such a piezoelectric element 100 is suitably used in devices such as, for example, actuators, vibration generating elements, ultrasonic motors, tactile sensors, force sensors, power generating elements, and various switches.

2. Apparatus for Manufacturing an Injection-Molded Article of Polymer Piezoelectric Material Next, an apparatus for manufacturing an injection-molded article of polymer piezoelectric material according to an embodiment will be described.

Figure 4:
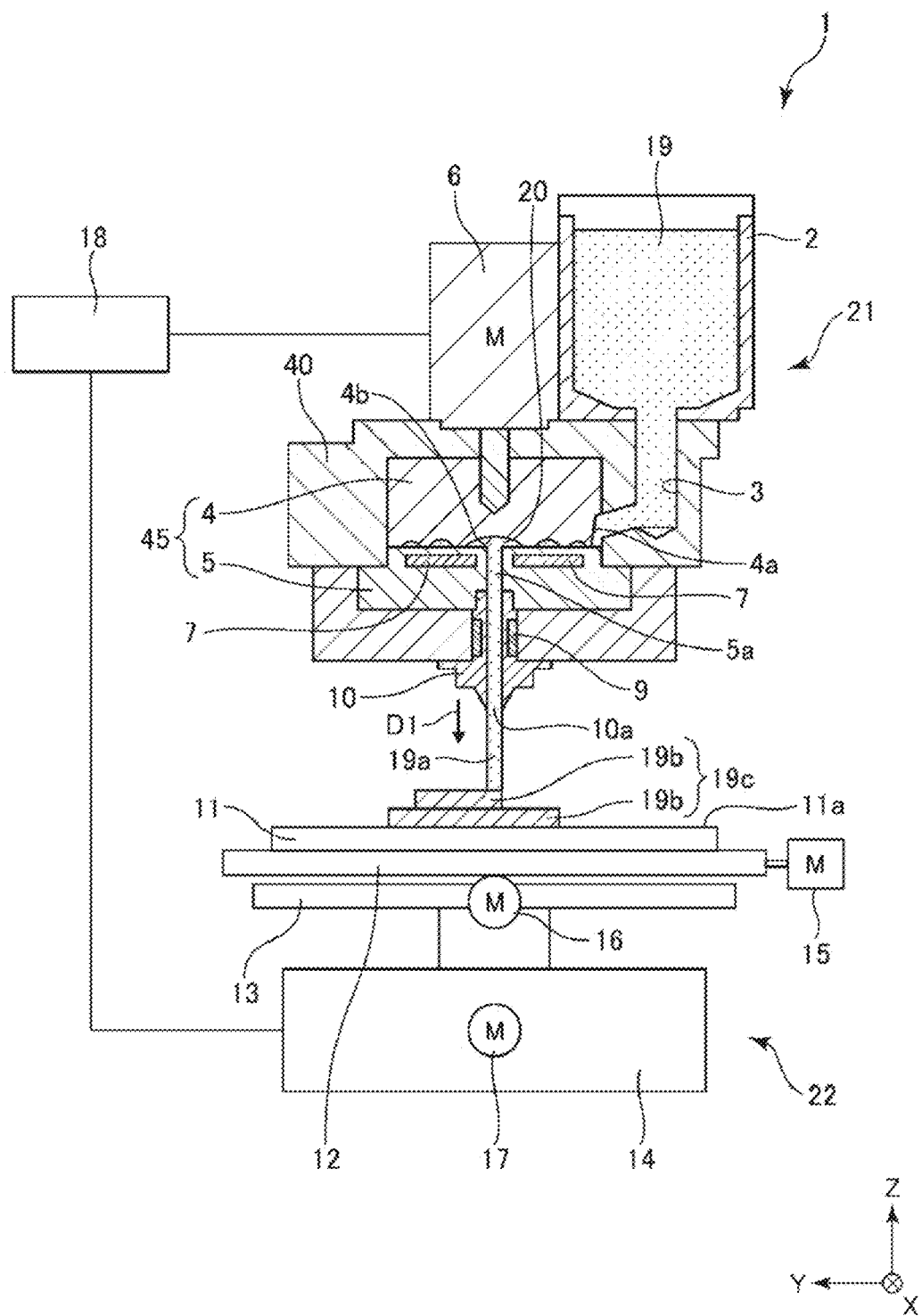
FIG. 4 is a cross-sectional view illustrating an apparatus for manufacturing an injection-molded article of polymer piezoelectric material according to an embodiment.
Figure 5:
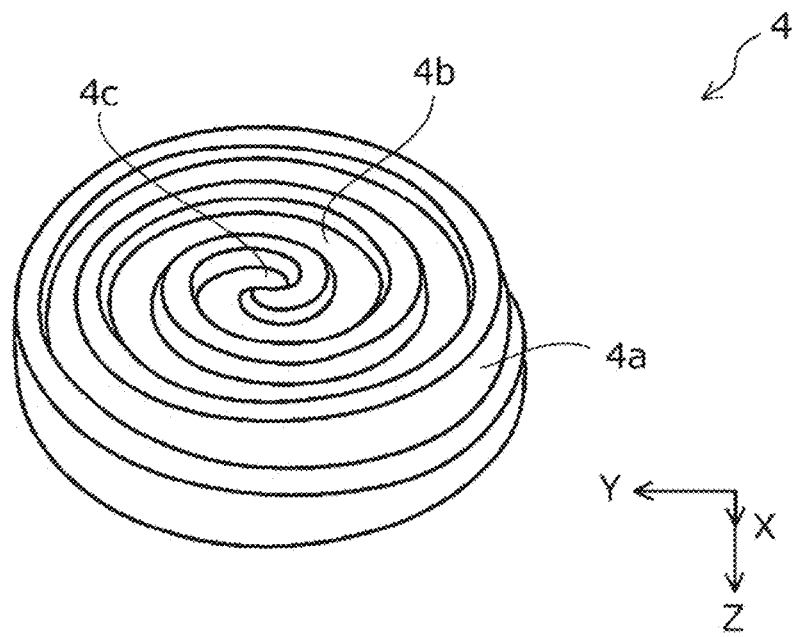
FIG. 5 is a perspective view illustrating a flat screw included in the apparatus for manufacturing of FIG. 4.
Figure 6:
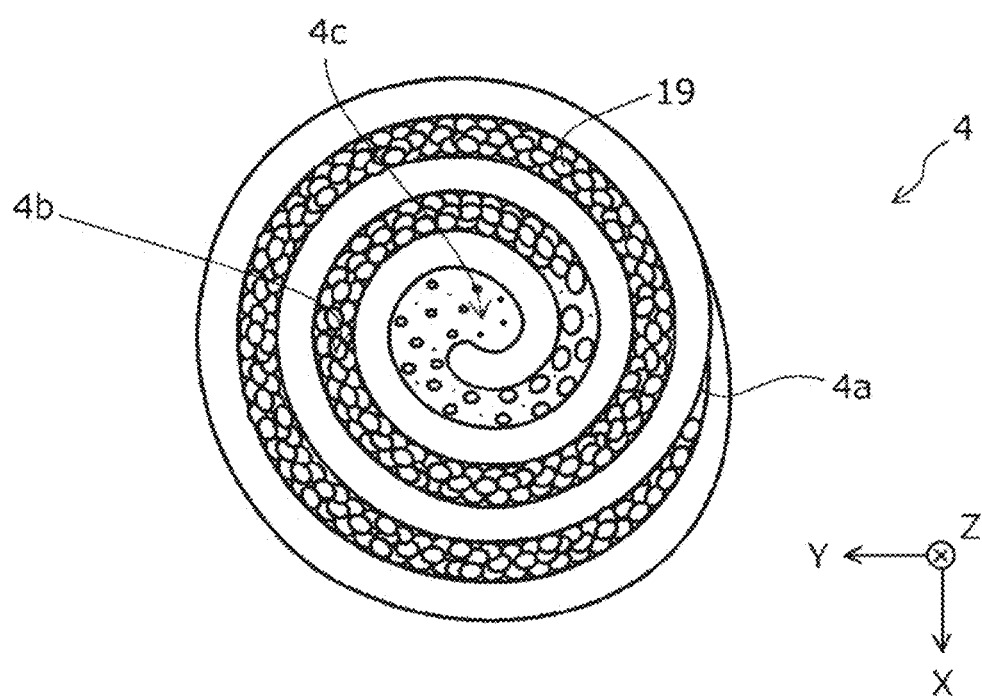
FIG. 6 is a schematic view illustrating a state in which the flat screw of FIG. 5 is filled with a material.
Figure 7:
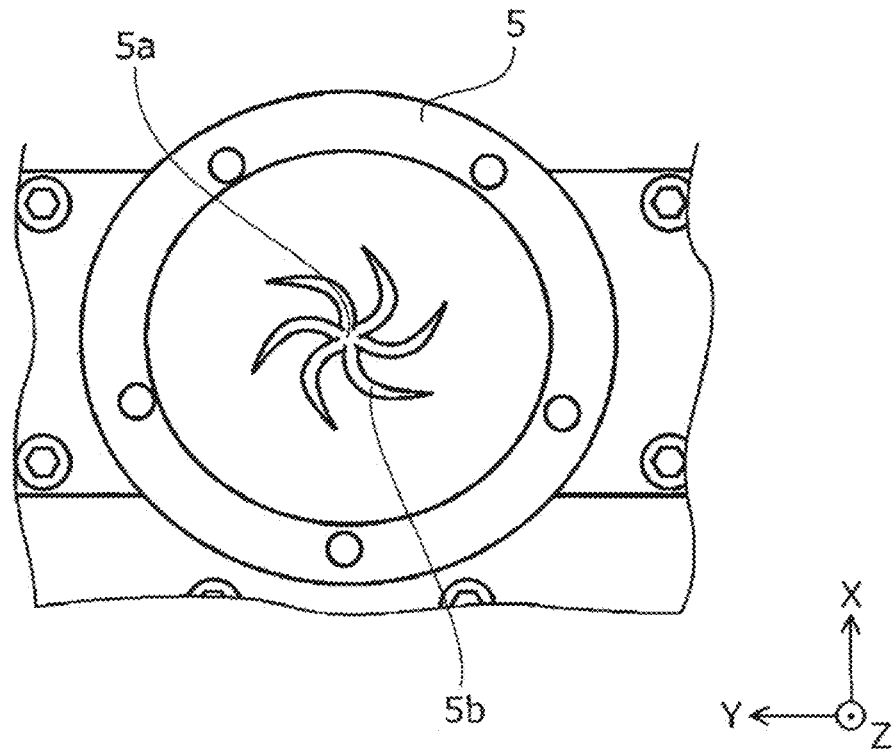
FIG. 7 is a schematic view illustrating a barrel included in the apparatus for manufacturing of FIG. 4.

FIG. 4 is a cross-sectional view illustrating an apparatus for manufacturing an injection-molded article of polymer piezoelectric material according to an embodiment. FIG. 5 is a perspective view illustrating a flat screw included in the apparatus for manufacturing of FIG. 4. FIG. 6 is a schematic view illustrating a state in which the flat screw of FIG. 5 is filled with a material. FIG. 7 is a schematic view illustrating a barrel included in the apparatus for manufacturing of FIG. 4.

Note that in FIGS. 4 to 7, an x-axis, a y-axis, and a z-axis are set as three axes orthogonal to each other. Each axis is represented by an arrow, with the tip side being "plus" and the base end side being "minus". In the description below, for example, the "X-axis direction" includes both the plus direction and the minus direction of the X-axis. Furthermore, the X-axis direction and the Y-axis direction are directions in the horizontal plane, while the Z-axis direction is the vertical direction.

An apparatus 1 for manufacturing a three-dimensional shaped article illustrated in FIG. 4 is an apparatus for manufacturing an injection-molded article of polymer piezoelectric material according to an embodiment, and is a so-called 3D printer. The apparatus 1 for manufacturing a three-dimensional shaped article includes an injection unit 21, a stage unit 22, and a control portion 18.

The injection unit 21 heats pellets 19, which are raw materials, to obtain molten material 19a and inject the obtained molten material 19a. The stage unit 22 receives the injected molten material 19a to obtain a deposit 19b, as well as a three-dimensional shaped article 19c in which deposits 19b are laminated. The control portion 18 controls various operations of the injection unit 21 and various operations of the stage unit 22.

The injection unit 21 illustrated in FIG. 4 includes a hopper 2, a supply pipe 3, a flat screw 4, a barrel 5, a motor 6, and a nozzle 10 (injection portion).

The hopper 2 is a container that houses pellets 19. The supply pipe 3 is a pipe that couples the hopper 2 and the flat screw 4.

The injection unit 21 also includes a screw case 40. The flat screw 4 is housed in a space formed between the screw case 40 and the barrel 5. Pellets 19 housed in the hopper 2 are supplied to this space via the feed pipe 3.

The flat screw 4 is coupled to a rotating shaft of the motor 6 and is rotated by the power of the motor 6. Furthermore, as illustrated in FIGS. 5 and 6, the flat screw 4 includes a helical notch 4b that extends from a circumferential surface 4a to a central portion 4c. As the flat screw 4 rotates, pellets 19 supplied into the screw case 40 are compressed while moving in a space portion 20 formed by the notch 4b and the barrel 5.

The barrel 5 includes a heater 7 built therein. Pellets 19 compressed in the space portion 20 molten (are plasticized) by the heat of the heater 7 into a molten material 19a. Therefore, the flat screw 4 and the barrel 5 constitute a melting unit 45 that heats and melts pellets 19.

As illustrated in FIG. 7, the barrel 5 includes a communication hole 5a extending in the Z-axis direction, and a plurality of grooves 5b formed in a surface facing the flat screw 4. The communication hole 5a is provided at a position corresponding to the central portion 4c of the flat screw 4. Furthermore, a nozzle 10 is provided on the minus side of the Z-axis of the communication hole 5a. The nozzle 10 includes a nozzle hole 10a. The communication hole 5a is coupled to this nozzle hole 10a. For this reason, the molten material 19a that moved while being pressurized to the central portion 4c of the flat screw 4 sequentially passes the grooves 5b and the communicating hole 5a, with the pressure serving as a driving force, before being injected from the nozzle hole 10a.

Furthermore, the nozzle 10 includes a heater 9 built therein. The temperature of the molten material 19a passing through the nozzle hole 10a is controlled by the heater 9 to a desired temperature.

The stage unit 22 illustrated in FIG. 4 includes a plate 11, a first stage 12, a second stage 13, a base portion 14, a first driving portion 15, a second driving portion 16, and a third driving portion 17.

The plate 11 has an upper surface 11a facing the plus side of the Z-axis. This upper surface 11a is a support surface that receives, and causes to be deposited, the molten material 19a injected from the nozzle hole 10a. This allows the deposit 19b to be obtained on the upper surface 11a. Further, deposits 19b stack up to form the three-dimensional shaped article 19c having a desired shape. The plate 11 is placed on the first stage 12.

The first stage 12 can move the plate 11 in the X-axis direction by the power of the first driving portion 15. The first stage 12 is placed on the second stage 13.

The second stage 13 moves the first stage 12 in the Y-axis direction by the power of the second driving portion 16. This allows the second stage 13 to move the plate 11 in the Y-axis direction.

The base portion 14 moves the second stage 13 in the Z-axis direction by the power of the third driving portion 17. This allows the base portion 14 to move the plate 11 in the Z-axis direction.

Therefore, the stage unit 22 functions as a so-called XYZ stage that moves the plate 11 to any position in the three-dimensional space. By moving the plate 11 in this way, the relative position of the nozzle hole 10a with respect to the plate 11 can be moved without changing the position of the nozzle 10. Therefore, three-dimensionally moving the position of the plate 11 while the molten material 19a is being injected from the nozzle hole 10a can three-dimensionally deposit the molten material 19a. As a result, the three-dimensional shaped article 19c having any shape can be formed.

Note that in the present embodiment, the plate 11 having the upper surface 11a is three-dimensionally moved. However, the nozzle 10 or, in other words, the injection unit 21 may be three-dimensionally moved. Furthermore, of the three axes of the X-axis, the Y-axis, and the Z-axis, the stage unit 22 may move the plate 11 along one axis or two axes, and move the nozzle 10 along the remaining axis.

Furthermore, while the apparatus 1 for manufacturing a three-dimensional shaped article is a so-called 3D printer, the apparatus for manufacturing an injection-molded article of polymer piezoelectric material is not limited to 3D printers, and may be an injection molding machine. An injection molding machine includes a mold having a cavity of any shape. Further, the molten material 19a injected from the nozzle 10 is filled into the cavity. Thereafter, the filling is released from the mold to obtain an injection-molded article. In this case, the support surface that receives the molten material 19a is not the upper surface 11a described above, but the inner surface of the cavity. Therefore, "molding" herein includes molding with a mold and shaping with a 3D printer.

The control portion 18 illustrated in FIG. 4 is electrically coupled to the injection unit 21 and the stage unit 22. The control portion 18 controls the operation of the injection unit 21 and the operation of the stage unit 22 while causing them to operate in coordination with each other.

The control portion 18 is realizable, for example, by a computer including a processor such as a central processing unit (CPU), a memory such as a random access memory (RAM) or a read-only memory (ROM), and an interface such as a universal serial bus (USB). A program or data is stored in the memory. The processor reads the program from the memory and executes the same to control the operation of the injection unit 21 and the stage unit 22.

As described above, the apparatus 1 for manufacturing a three-dimensional shaped article, which is an apparatus for manufacturing an injection-molded article of polymer piezoelectric material according to the present embodiment, includes the flat screw 4 and the barrel 5 that serve as the melting unit 45, the nozzle 10 that serves as the injection portion, and the upper surface 11a that serves as the support surface. The flat screw 4 and the barrel 5 heat pellets 19, which are raw materials containing helical chiral polymers, to obtain a molten material 19a. The nozzle 10 injects the molten material 19a. The upper surface 11a receives the injected molten material 19a to obtain the three-dimensional shaped article 19c that is an injection-molded article having piezoelectricity. The temperature of the upper surface 11a, that is, the temperature of the plate 11 is at a temperature greater than or equal to the phase transition temperature of the helical chiral polymer and less than its melting point. A phase transition temperature is the temperature at which a phase transition of the helical chiral polymer from a metastable phase to a stable phase takes place.

According to such an apparatus 1 for manufacturing a three-dimensional shaped article, the molten material 19a is injected at a high pressure and deposited on the upper surface 11a.

FIG. 4 schematically illustrates the three-dimensional shaped article 19c manufactured by the apparatus 1 for manufacturing a three-dimensional shaped article. Since the molten material 19a is injected at a high pressure, a pressing force in an injecting direction D1 is applied to the deposit 19b, which is the molten material 19a deposited on the upper surface 11a. For this reason, when the deposit 19b contains polylactic acid as helical chiral polymer, for example, the axis of travel of the spiral SP included in the molecular structure of polylactic acid, that is, the c-axis that is the longest axis in the unit cell of polylactic acid, is oriented along the upper surface 11a. Furthermore, the b-axis that is the shortest axis in the unit cell of polylactic acid is uniaxially oriented in a direction intersecting the upper surface 11a. Cooling this deposit 19b yields the three-dimensional shaped article 19c. In this way, the piezoelectric layer 20 can be obtained.

As described previously, such a piezoelectric layer 200 exhibits the piezoelectric phenomenon associated with rotational stress. Thus, when applied to sensors, actuators, and the like, for example, such a piezoelectric layer 200 offers ease of use.

Furthermore, optimizing the temperature of the plate 11 makes it possible to cool the deposit 19b in a temperature range in which no phase transition to a metastable phase takes place, that is, in a temperature range in which a stable phase is maintained. This makes it possible to sufficiently increase the degree of orientation of the uniaxial orientation of b-axes. As a result, a piezoelectric layer 200 having good piezoelectricity can be obtained.

Moreover, depositing a plurality of deposits 19b as necessary can yield a three-dimensional shaped article 19c that is thicker than a single-layer deposit 19b. This makes it possible to easily increase the thickness of the piezoelectric layer 200. Note that the three-dimensional shaped article 19c may be constituted by a single-layer deposit 19b.

As described above, the three-dimensional shaped article 19c may be constituted by a laminate in which a plurality of deposits 19b that are unit layers are laminated. Even in this case, b-axes of the helical chiral polymer are uniaxially oriented in the thickness direction of the deposits 19b. This makes it possible to obtain, with any thickness, a piezoelectric layer 200 in which b-axes are uniaxially oriented and that has high piezoelectricity.

The temperature of the nozzle 10 (injection portion) may be greater than or equal to the melting point of the helical chiral polymer. This makes it possible to maintain helical chiral polymers contained in the molten material 19a in a good molten state until immediately before injection. As a result, a piezoelectric layer 200 having a high degree of orientation of the uniaxial orientation of b-axes can be obtained. Such a piezoelectric layer 200 has good piezoelectricity.

It is sufficient that the temperature of the nozzle 10 is greater than or equal to the melting point of the helical chiral polymer. However, the temperature of the nozzle 10 may be set 10° C. or more higher than the melting point; may be set 20° C. or more higher than the melting point and less than the pyrolysis temperature of the helical chiral polymer; and may be set 30° C. or more higher than the melting point and 10° C. or more lower than the pyrolysis temperature.

For example, the melting point of the α-phase of poly-L-lactic acid is approximately 182° C. and its pyrolysis temperature is approximately 250° C. For this reason, the temperature of the nozzle 10 that injects the molten material 19a containing polylactic acid may be set to 192° C. or greater; may be set to 202° C. or greater and less than 250° C.; and may be set to 212° C. or greater and 240° C. or less.

The temperature of the barrel 5 is not particularly limited. However, the temperature of the barrel 5 may be within a range of ±30° C. from the temperature of the nozzle 10, and may be within a range of ±15° C. from the temperature of the nozzle 10. This makes it possible to increase the kneading performance of the flat screw 4, and ultimately manufacture a piezoelectric layer 200 having a particularly high degree of orientation of the uniaxial orientation of b-axes.

Furthermore, in particular, when the helical chiral polymer is polylactic acid, the temperature of the upper surface 11a (support surface) may be set in accordance with the phase transition temperature from a metastable phase to a stable phase. Specifically, the α'-phase is known as a metastable phase of polylactic acid, and the α-phase is known as a stable phase. Therefore, the temperature of the upper surface 11a may be set to be greater than or equal to the phase transition temperature at which a phase transition from the α'-phase to the α-phase takes place, and less than the melting point of polylactic acid. This makes it possible to suppress the molten material 19a from being quenched, and suppress the metastable phase from being generated. As a result, a piezoelectric layer 200 that has high piezoelectricity and that includes a chemically-stable stable phase as main material can be manufactured.

It is sufficient that the temperature of the upper surface 11a, that is, the temperature of the plate 11 is greater than or equal to the phase transition temperature of polylactic acid and less than its melting point. However, the temperature of the plate 11 may be set 10° C. or more higher than the phase transition temperature and 10° C. or more lower than the melting point of polylactic acid, and may be set 20° C. or more higher than the phase transition temperature and 30° C. or more lower than the melting point of polylactic acid. Specifically, the phase transition temperature of polylactic acid from the α'-phase to the α-phase is approximately 96° C. Therefore, the temperature of the plate 11 may be set to 106° C. or greater and 172° C. or less, and may be set to 116° C. or greater and 152° C. or less.

Furthermore, as described previously, the melting unit 45 includes the flat screw 4. The flat screw 4 compresses pellets 19 that are raw materials. This achieves the uniaxial orientation of b-axes of the helical chiral polymer at a higher degree of orientation. Furthermore, even when the amount of pellets 19 is small, the flat screw 4 can efficiently knead and compress them in a shorter period of time compared to other screws. For this reason, the time it takes for pellets 19 to melt can be shortened, making the molten material 19a less likely to degrade due to heating, oxidation, and the like.

Note that while the flat screw 4 has many advantages for the reasons described above, the flat screw 4 may be replaced by any screw that demonstrates a similar action.

The inner diameter of the nozzle hole 10a is not particularly limited. However, the inner diameter of the nozzle hole 10a may be 0.1 mm or greater and 3.0 mm or less, and may be 0.2 mm or greater and 0.5 mm or less. Setting the inner diameter of the nozzle hole 10a within the aforementioned ranges makes it possible to apply sufficient pressure to the molten material 19a to maintain a good kneading state. As a result, the uniaxial orientation of b-axes of helical chiral polymers in the piezoelectric layer 200 can be achieved at a higher degree of orientation.

3. Method of Manufacturing an Injection-Molded Article of Polymer Piezoelectric Material Next, a method for manufacturing an injection-molded article of polymer piezoelectric material according to an embodiment will be described.

Figure 8:
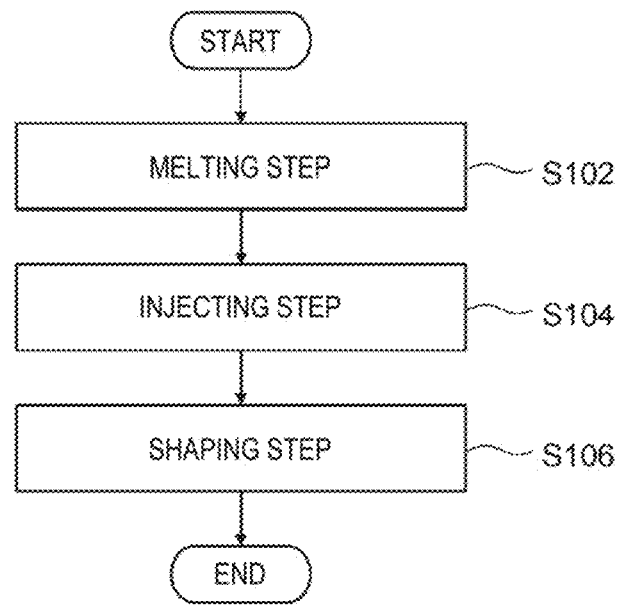
FIG. 8 is a flowchart for describing a method for manufacturing an injection-molded article of polymer piezoelectric material according to an embodiment.

FIG. 8 is a flowchart for describing a method for manufacturing an injection-molded article of polymer piezoelectric material according to an embodiment. In the description below, a method for manufacturing that uses the apparatus 1 for manufacturing a three-dimensional shaped article illustrated in FIGS. 4 to 7 is described.

The method for manufacturing illustrated in FIG. 8 includes a melting step S102 for obtaining the molten material 19a, an injecting step S104 for injecting the molten material 19a, and a shaping step S106 for obtaining the three-dimensional shaped article 19c that is an injection-molded article. Hereinafter, each of the steps will be sequentially described.

3.1. Melting Step

In the melting step S102, pellets 19 containing helical chiral polymers are supplied into the space formed between the screw case 40 and the barrel 5. Pellets 19 melts while moving in the space portion 20 formed between the flat screw 4 and the barrel 5, which serves as the melting unit 45, to turn into the molten material 19a. The molten material 19a is compressed as the flat screw 4 rotates.

3.2. Injecting Step

In the injecting step S104, the molten material 19a is injected from the nozzle 10. Since it is compressed by the flat screw 4, the molten material 19a is injected by that pressure.

3.3. Shaping Step

In the shaping step S106, the injected molten material 19a is received at the upper surface 11a of the plate 11. This allows the deposit 19b to be obtained on the upper surface 11a, and deposits 19b are stacked up to yield the three-dimensional shaped article 19c.

As described above, the method for manufacturing illustrated in FIG. 8 includes the melting step S102 for obtaining the molten material 19a, the injecting step S104 for injecting the molten material 19a, and the shaping step S106 for obtaining the three-dimensional shaped article 19c that is an injection-molded article. In the melting step S102, pellets 19 (raw materials) containing helical chiral polymers are heated to obtain the molten material 19a. In the injecting step S104, the molten material 19a is injected from the nozzle 10 (injection portion). In the shaping step S106, the injected molten material 19a is received at the upper surface 11a (support surface) of the plate 11 to obtain the injection-molded article 19c having piezoelectricity. The temperature of the upper surface 11a, that is, the temperature of the plate 11 is at a temperature greater than or equal to the phase transition temperature of the helical chiral polymer and less than its melting point. A phase transition temperature is the temperature at which a phase transition of the helically-chiral polymer from a meta-stable phase to a stable phase takes place.

According to such a configuration, when the shortest crystal axis of the helical chiral polymer is the b-axis, it is possible to obtain a deposit 19b in which b-axes are uniaxially oriented in the thickness direction of the deposit 19b. Cooling this deposit 19b yields the three-dimensional shaped article 19c. In this way, the piezoelectric layer 20 can be obtained.

As described previously, such a piezoelectric layer 200 exhibits the piezoelectric phenomenon associated with rotational stress in addition to shear stress. Thus, when applied to sensors, actuators, and the like, for example, such a piezoelectric layer 200 offers ease of use.

Furthermore, optimizing the temperature of the plate 11 makes it possible to cool the deposit 19b in a temperature range in which no phase transition to a metastable phase takes place, that is, in a temperature range in which a stable phase is maintained. This makes it possible to sufficiently increase the degree of orientation of the uniaxial orientation of b-axes. As a result, a piezoelectric layer 200 having good piezoelectricity can be obtained.

An injection-molded article of polymer piezoelectric material, a piezoelectric element, an apparatus for manufacturing an injection-molded article of polymer piezoelectric material, and a method for manufacturing an injection-molded article of polymer piezoelectric material according to the present disclosure have been described. However, an injection-molded article of polymer piezoelectric material, an apparatus for manufacturing an injection-molded article of polymer piezoelectric material, and a piezoelectric element according to the present disclosure are not limited to the above-described embodiments. For example, each portion of the above-described embodiments may be replaced with a portion of any configuration that has a similar function, and any component may be added to the above-described embodiments. Furthermore, a method for manufacturing an injection-molded article of polymer piezoelectric material according to the present disclosure is not limited to the above-described embodiments. For example, a step for any purpose may be added to the above-described embodiments.

EXAMPLES

Next, specific examples of the present disclosure will be described.
4. Manufacture of Piezoelectric Test Pieces Examples First, as an example of a helical chiral polymer, pellets of poly-L-lactic acid (PLLA) available from BMG Incorporated were procured. The melting point of this polylactic acid was 182° C., its pyrolysis temperature was 250° C., and its phase transition temperature from the α'-phase to the α-phase was 96° C.

Next, the polylactic acid pellets were fed into the apparatus for manufacturing a three-dimensional shaped article illustrated in FIG. 4. The molten material was injected while being turned in a fixed direction to obtain a piezoelectric test piece constituted by a deposit having a two-layer structure. The obtained piezoelectric test piece was a disc having a diameter of 30 mm.

Note that the inner diameter of the nozzle was 0.3 mm, the temperature of the nozzle was 225° C., the temperature of the barrel was 215° C., and the temperature of the plate was 120° C.

Comparative Example 1

A piezoelectric test piece was obtained in the same manner as in the example except that the temperature of the plate was changed to 50° C.

Comparative Example 2

A piezoelectric test piece was obtained in the same manner as in the example except that the temperature of the plate was changed to 80° C.

Comparative Example 3

A piezoelectric test piece was obtained in the same manner as in the example except that the temperature of the plate was changed to 100° C.
5. Evaluation of Raw Materials and Piezoelectric Test Pieces
5.1. Differential Scanning Calorimetry (DSC) of Raw Materials First, DSC measurements were performed on the polylactic acid pellets that were raw materials. A differential scanning calorimeter "Q1000" available from TA Instruments was used for the measurements. In the DSC measurements, a melting endotherm curve was acquired while changing the temperature in three processes: a first heating process, a cooling process, and a second heating process. Specifically, in the first heating process, the temperature was raised from −20° C. to 270° C. at a heating rate of 5° C./minute. In the cooling process, the temperature was lowered from 270° C. to −20° C. at a cooling rate of 5° C./minute. In the second heating process, the temperature was raised from −20° C. to 270° C. at a heating rate of 5° C./minute.

Figure 9:
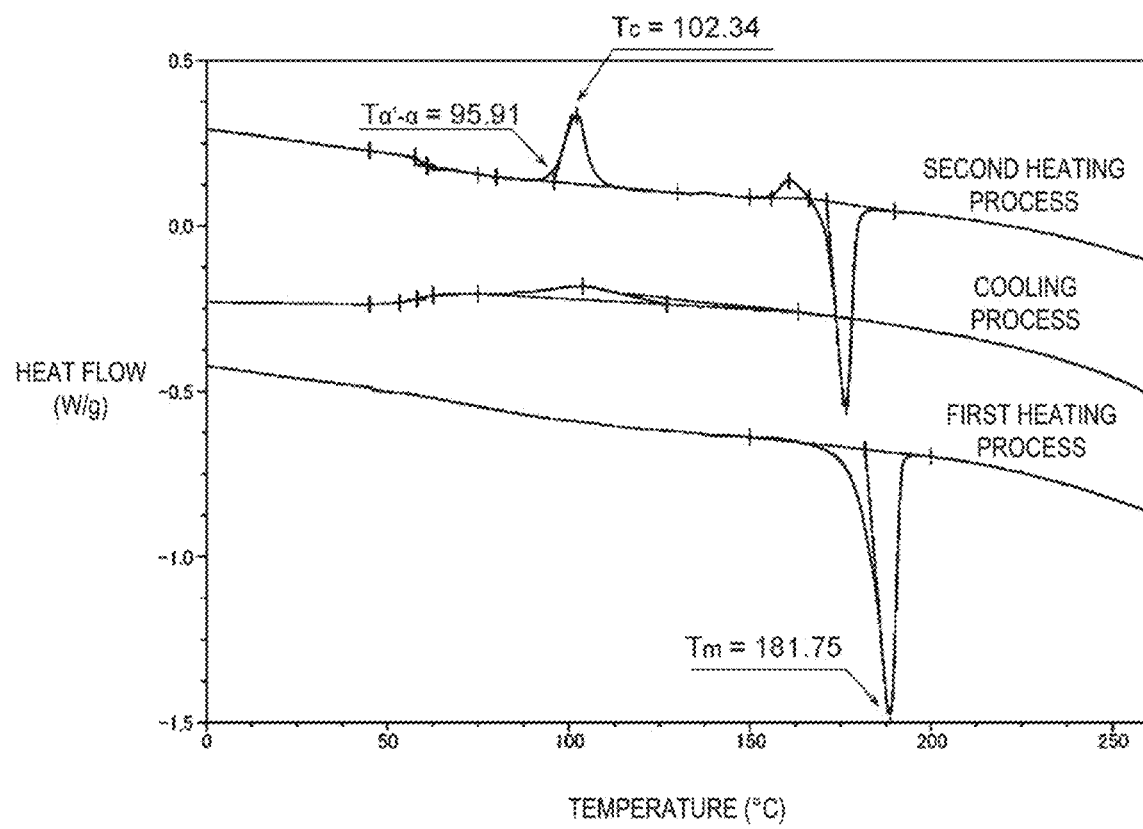
FIG. 9 is a graph showing a portion of a melting endotherm curve obtained by DSC measurements conducted on polylactic acid pellets that are raw materials.

A portion of the obtained melting endotherm curve is shown in FIG. 9. FIG. 9 is a graph showing a portion of a melting endotherm curve obtained by DSC measurements conducted on polylactic acid pellets that are raw materials. As illustrated in FIG. 9, in the first heating process, a melting point was observed at 181.75° C. In the second heating process, a phase transition temperature from the α'-phase, which is a metastable phase, to the α-phase, which is a stable phase, was observed at 95.91° C.
5.2. X-Ray Diffraction of Piezoelectric Test Pieces Next, θ-2θ measurements were performed on the piezoelectric test pieces obtained in the example and the comparative examples by the focusing method using an X-ray diffractometer. Furthermore, rocking curve profile measurements were performed with an X-ray detector fixed at a predetermined 2θ position while changing the incident angle. For X-ray diffractometer, an XRD measurement apparatus "X'Pert" available from Malvern Panalytical Ltd. was used. Furthermore, for X-ray diffraction, a characteristic X-ray of CuKα1 having a wavelength of 1.5404 Å was used.

Figure 10:
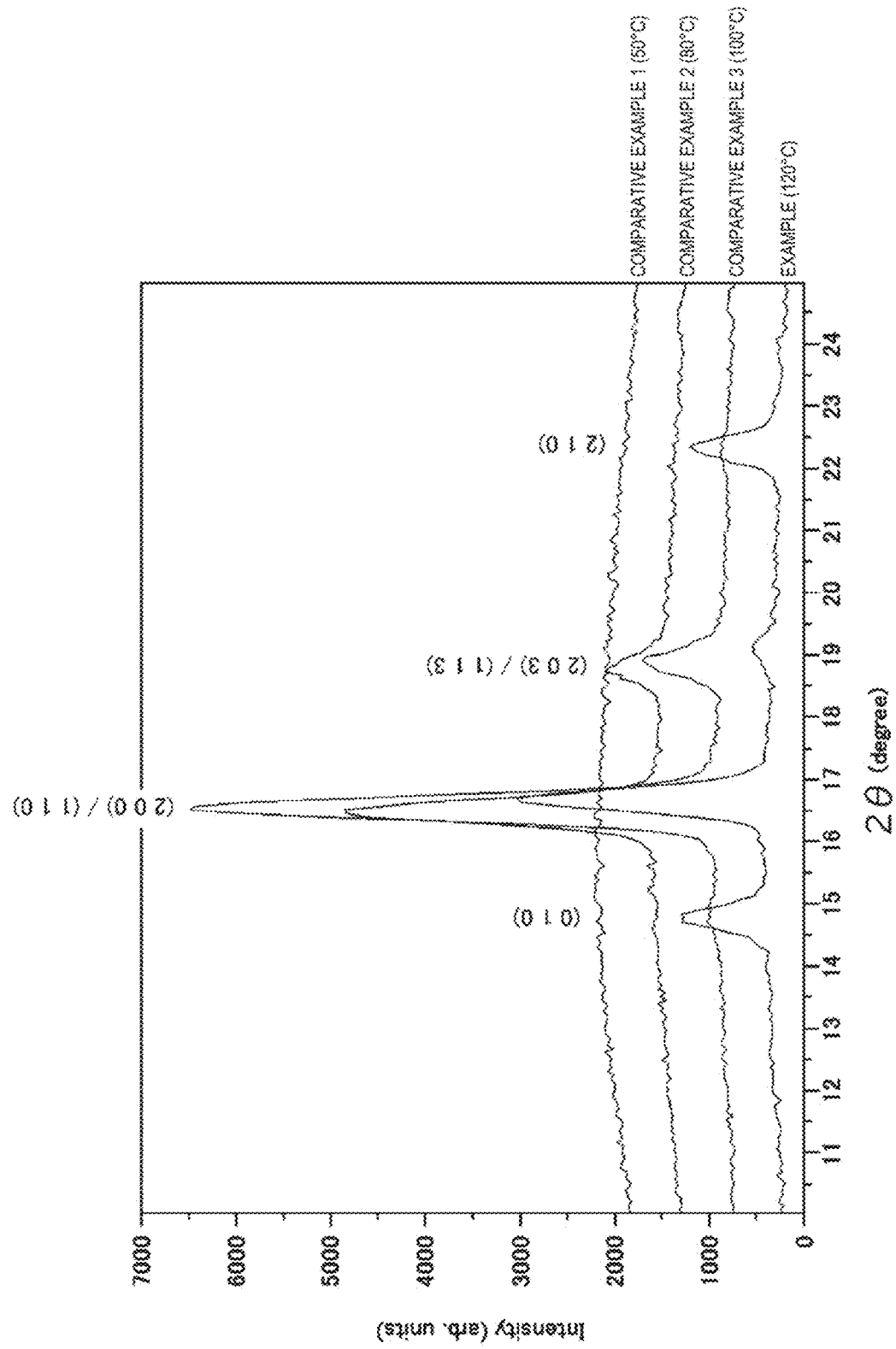
FIG. 10 is a set of θ-2θ profiles, obtained by θ-2θ measurements in an X-ray diffractometer, for piezoelectric test pieces obtained in an example and comparative examples.

FIG. 10 is a set of θ-2θ profiles, obtained by θ-2θ measurements, for piezoelectric test pieces obtained in the example and the comparative examples.

As shown in FIG. 10, no peaks were observed in the θ-2θ profile acquired from the piezoelectric test piece obtained in the comparative example 1. Therefore, it was found that polylactic acid was not crystallized in the piezoelectric test piece obtained in the comparative example 1.

Peaks were observed near 2θ=16.5° in the θ-2θ profiles acquired from the piezoelectric test pieces obtained in the comparative examples 2 and 3. On the other hand, a peak was also observed near 2θ=16.7° in the θ-2θ profile acquired from the piezoelectric test piece obtained in the example. All of these peaks are considered to correspond to the (110) plane/(200) plane.

Accordingly, rocking curve profiles were acquired for the piezoelectric test pieces obtained in the example and the comparative examples with the 2θ position fixed at 16.7°.

Figure 11:
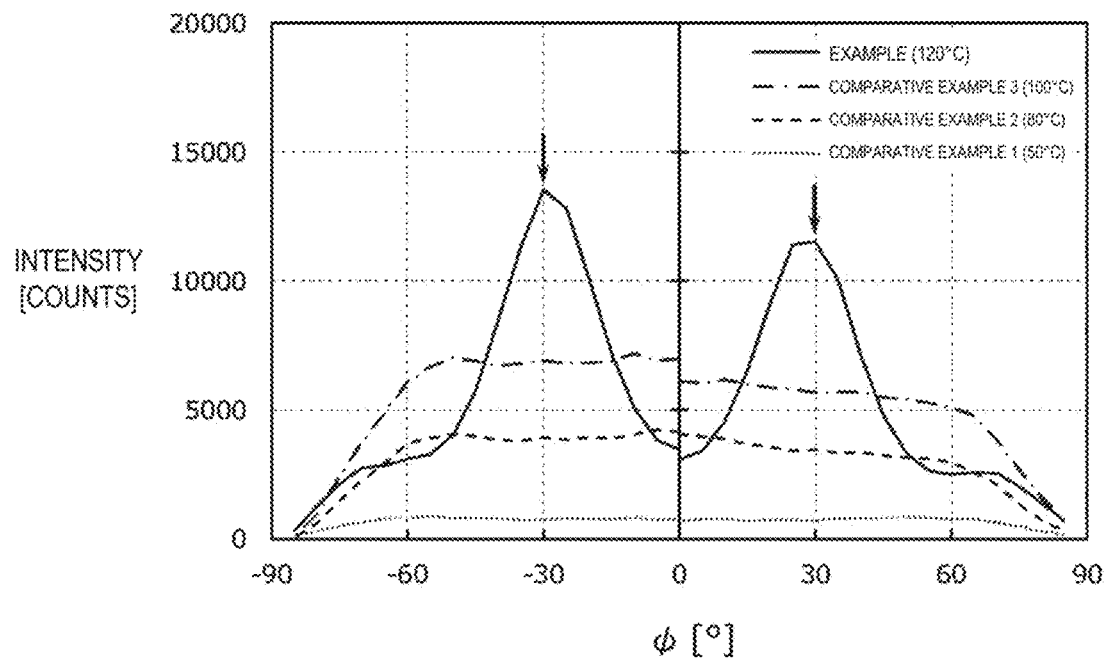
FIG. 11 is a set of rocking curve profiles for the respective piezoelectric test pieces with the 2θ position fixed at 16.7°.

FIG. 11 is a set of rocking curve profiles for the respective piezoelectric test pieces with the 2θ position fixed at 16.7°.

In FIG. 11, only for the rocking curve profile acquired from the piezoelectric test piece obtained in the example, were peaks originating from the uniaxial orientation at some crystal plane observed near ψ=±30°.

On the other hand, for the θ-2θ profile acquired from the piezoelectric test piece obtained in the example, as illustrated in FIG. 10, a peak was also observed near 2θ=14.7°. This peak is considered to correspond to the (010) plane.

Accordingly, for the piezoelectric test pieces obtained in the example and the comparative examples, rocking curve profiles were acquired with the 2θ position fixed at 14.7°.

Figure 12:
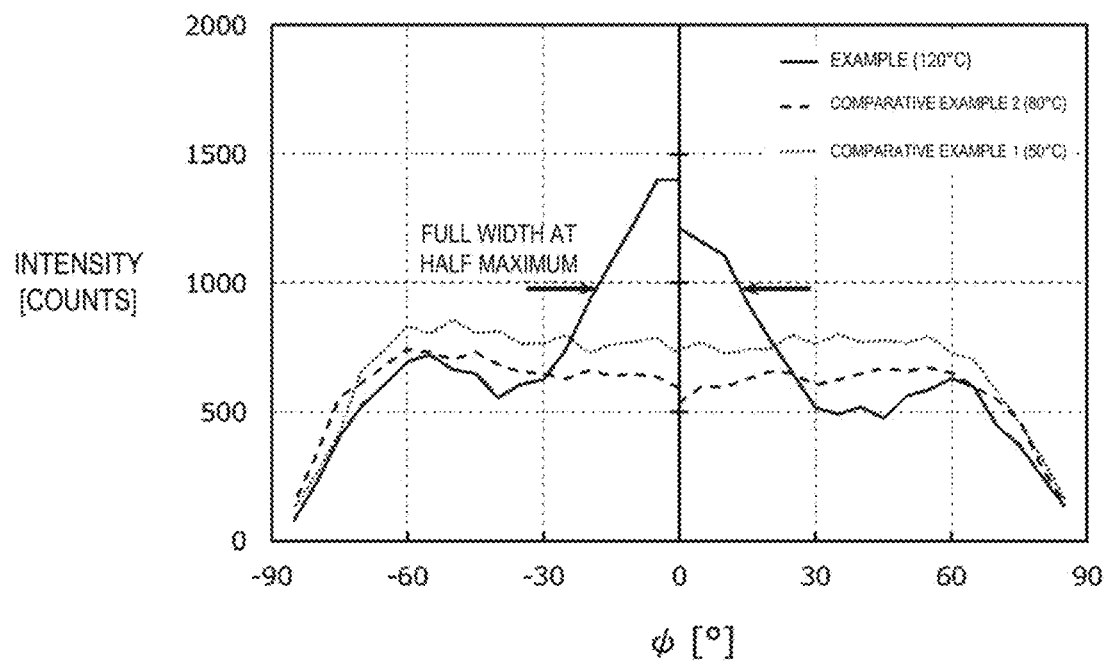
FIG. 12 is a set of rocking curve profiles for the respective piezoelectric test pieces with the 2θ position fixed at 14.7°.

FIG. 12 is a set of rocking curve profiles for the respective piezoelectric test pieces with the 2θ position fixed at 14.7°.

In FIG. 12, only for the rocking curve profile acquired from the piezoelectric test piece obtained in the example, was a peak observed at ψ=0°. Therefore, it was found that the piezoelectric test piece obtained in the example contained crystals in which a (010) orientation or the so-called uniaxial orientation of b-axes occurred.

Note that in the rocking curve profile shown in FIG. 12, the full width at half maximum (FWHM) of the peak derived from the uniaxial orientation of b-axes is approximately 31°. This full width at half maximum may be 50° or less, and may be 40° or less. In this way, it is considered that a sufficient degree of orientation has been obtained.

What is claimed is:

1. An injection-molded article of polymer piezoelectric material, comprising:
   a helical chiral polymer constituted by a polymer chain and having a unit cell having dimensions that extend along each of an a-axis, a b-axis, and a c-axis as crystal axes;
   wherein the c-axis extends in a direction that is parallel to a long chain direction of the polymer chain,
   the a-axis extends in a first direction that is orthogonal to the c-axis,
   the b-axis extends in a second direction that is orthogonal to each of the a-axis and the c-axis,
   the helical chiral polymer is a crystal in which the b-axis is uniaxially oriented,
   (a length of the unit cell along the b-axis)<(a length of the unit cell along the a-axis)<(a length of the unit cell along the c-axis), and
   the injection-molded article has piezoelectricity.

2. The injection-molded article of polymer piezoelectric material according to claim 1, wherein
   the injection-molded article is constituted by a laminate in which a plurality of unit layers is laminated and the b-axis is uniaxially oriented in a thickness direction of the unit layers.

3. The injection-molded article of polymer piezoelectric material according to claim 1, wherein the helical chiral polymer is a polylactic acid.

4. The injection-molded article of polymer piezoelectric material according to claim 2, wherein the helical chiral polymer is a polylactic acid.

5. The injection-molded article of polymer piezoelectric material according to claim 3, wherein
   a θ-2θ profile in X-ray diffraction measurements has a peak corresponding to a (010) plane of a polylactic acid and
   when a rocking curve profile is acquired for the peak corresponding to the (010) plane, the rocking curve profile has a peak at ψ=0°.

6. The injection-molded article of polymer piezoelectric material according to claim 4, wherein
   a θ-2θ profile in X-ray diffraction measurements has a peak corresponding to a (010) plane of a polylactic acid and
   when a rocking curve profile is acquired for the peak corresponding to the (010) plane, the rocking curve profile has a peak at ψ=0°.

7. A piezoelectric element comprising:
   the injection-molded article of polymer piezoelectric material according to claim 1; and
   two electrode layers configured to sandwich the injection-molded article of polymer piezoelectric material.

8. A piezoelectric element comprising:
   the injection-molded article of polymer piezoelectric material according to claim 2; and
   two electrode layers configured to sandwich the injection-molded article of polymer piezoelectric material.

9. A piezoelectric element comprising:
   the injection-molded article of polymer piezoelectric material according to claim 3; and
   two electrode layers configured to sandwich the injection-molded article of polymer piezoelectric material.

10. A piezoelectric element comprising:
    the injection-molded article of polymer piezoelectric material according to claim 4; and
    two electrode layers configured to sandwich the injection-molded article of polymer piezoelectric material.

11. A piezoelectric element comprising:
    the injection-molded article of polymer piezoelectric material according to claim 5; and
    two electrode layers configured to sandwich the injection-molded article of polymer piezoelectric material.

12. A piezoelectric element comprising:
    the injection-molded article of polymer piezoelectric material according to claim 6; and
    two electrode layers configured to sandwich the injection-molded article of polymer piezoelectric material.

* * * * *